US007618752B2

(12) United States Patent
Stewart et al.

(10) Patent No.: US 7,618,752 B2
(45) Date of Patent: Nov. 17, 2009

(54) DEFORMATION-BASED CONTACT LITHOGRAPHY SYSTEMS, APPARATUS AND METHODS

(75) Inventors: Duncan R. Stewart, Menlo Park, CA (US); Robert Walmsley, Palo Alto, CA (US); Peter G. Hartwell, Sunnyvale, CA (US); Wei Wu, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 498 days.

(21) Appl. No.: 11/548,975

(22) Filed: Oct. 12, 2006

(65) Prior Publication Data

US 2008/0090155 A1 Apr. 17, 2008

(51) Int. Cl.
*G03F 1/00* (2006.01)

(52) U.S. Cl. .......................................................... 430/5

(58) Field of Classification Search ..................... 430/5; 716/19, 20, 21; 355/72

See application file for complete search history.

(56) References Cited

U.S. PATENT DOCUMENTS

| | | | | |
|---|---|---|---|---|
| 5,160,959 | A | 11/1992 | Everett et al. | |
| 6,294,450 | B1 | 9/2001 | Chen et al. | |
| 6,482,742 | B1 | 11/2002 | Chou | |
| 6,713,238 | B1 | 3/2004 | Chou et al. | |
| 6,719,915 | B2 | 4/2004 | Wilson et al. | |
| 6,847,433 | B2 * | 1/2005 | White et al. | 355/72 |
| 2005/0115503 | A1 * | 6/2005 | Hagiwara et al. | 118/721 |
| 2006/0043626 | A1 | 3/2006 | Wu et al. | |
| 2007/0035717 | A1 | 2/2007 | Wu et al. | |

FOREIGN PATENT DOCUMENTS

| | | |
|---|---|---|
| JP | 06 145874 | 5/1994 |
| JP | 2001 035780 | 2/2001 |
| JP | 2003 068616 | 3/2003 |
| JP | 2004 111713 | 4/2004 |
| JP | 2005 020015 | 1/2005 |
| WO | WO 02/07199 A1 | 2/2002 |
| WO | WO2008/048215 | 4/2008 |

OTHER PUBLICATIONS

D. J. Resnick et al., "Imprint Lithography for Integrated Circuit Fabrication," J. Vac. Sci. Technol., B 21(6), Nov./Dec. 2003, pp. 2624-2631.

Xing Cheng et al., "One-Step Lithography for Various Size Patterns With A Hybrid Mask-Mold," Microelectronics Engineering, 71, 2004, pp. 288-293.

* cited by examiner

*Primary Examiner*—Stephen Rosasco

(57) ABSTRACT

One or more of a contact lithography module, a pattern tool and a substrate include a strain control region to prevent deformation-related misalignment.

22 Claims, 12 Drawing Sheets

DEFORMATION-BASED CONTACT LITHOGRAPHY SYSTEMS, APPARATUS AND METHODS

CROSS-REFERENCE TO RELATED APPLICATIONS

This application is related to commonly-owned U.S. application Ser. No. 11/203,551, filed Aug. 12, 2005 and entitled "Contact Lithography Apparatus, System and Method."

BACKGROUND OF THE INVENTIONS

Contact lithography, such as photographic contact lithography and imprint lithography, is a lithographic methodology that employs a direct or physical contact between a pattern tool and pattern receiving material on a substrate. In photographic contact lithography, for example, the pattern tool is a photomask. Physical contact is established between the photomask and a photosensitive layer on the substrate. During the physical contact, radiation passes through the photomask and exposes the photosensitive layer. As a result, a pattern of the photomask is transferred to the substrate. Imprint lithography, on the other hand, involves the formation of a relief pattern in material that is carried on the surface of a substrate. In one type of imprint lithography process, the pattern tool is a template (or "mold") with a relief pattern. The template is brought into contact with a material on a substrate that is in liquid form at room temperature, or that is liquefied by heating. The liquid material fills the template and assumes the shape of the relief pattern. The material is then subjected to conditions that cause the material to solidify and the template is removed. A structure in the shape of the relief pattern will then remain on the substrate.

One important aspect of contact lithography is the alignment of the pattern tool and the substrate. The alignment process typically involves holding the pattern tool a small distance from the substrate while lateral and rotational adjustments (such as X-Y translation and/or angular rotation) are made. The pattern tool is then brought in contact with the substrate to perform the lithographic patterning.

Deformation-based contact lithography techniques, which involve the use of a spacer between the pattern tool and the substrate, as well as deformation that results in pattern tool/substrate contact, have been proposed in order to facilitate proper alignment. In particular, deformation-based contact lithography techniques insure that the pattern tool and substrate are mutually parallel and proximal during the alignment process, and reduce the likelihood that there will be a drift or slip in the relative positioning of the pattern tool and substrate as the pattern tool and substrate are brought into contact with one another after alignment. These advantages notwithstanding, the present inventors have determined that deformation-based contact lithography is susceptible to improvement.

BRIEF DESCRIPTION OF THE DRAWINGS

Detailed description of embodiments will be made with reference to the accompanying drawings.

DETAILED DESCRIPTION OF THE EMBODIMENTS

The following is a detailed description of the best presently known modes of carrying out the inventions. This description is not to be taken in a limiting sense, but is made merely for the purpose of illustrating the general principles of the inventions. It is noted that detailed discussions of aspects of contact lithography systems and methods that are not required for the understanding of the present inventions, such as the specific characteristics of the pattern tool aligner, have been omitted for the sake of simplicity. The present inventions are also applicable to a wide range of contact lithography systems and methods, including those presently being developed or yet to be developed. Such systems include, but are not limited to photographic contact lithography, X-ray contact lithography and imprint lithography.

Figures 1A, 1B, 1C:
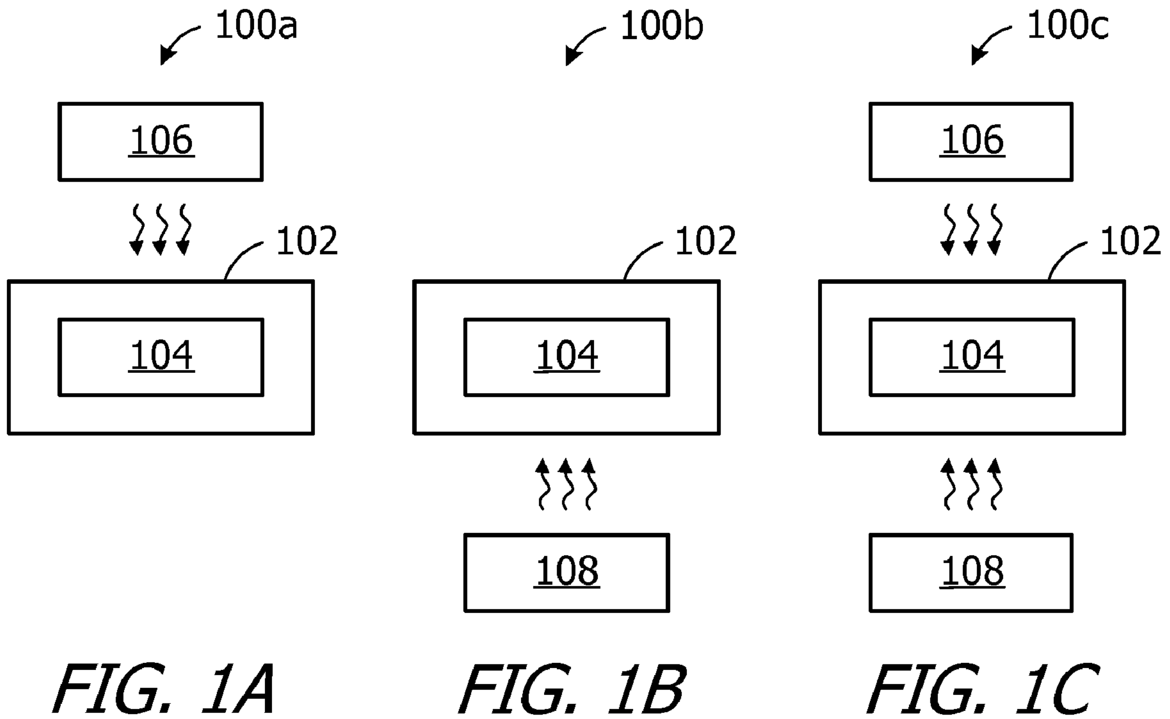
FIG. 1A is a block diagram of a contact lithography system in accordance with one embodiment of a present invention.
FIG. 1B is a block diagram of a contact lithography system in accordance with one embodiment of a present invention.
FIG. 1C is a block diagram of a contact lithography system in accordance with one embodiment of a present invention.
Figure 2:
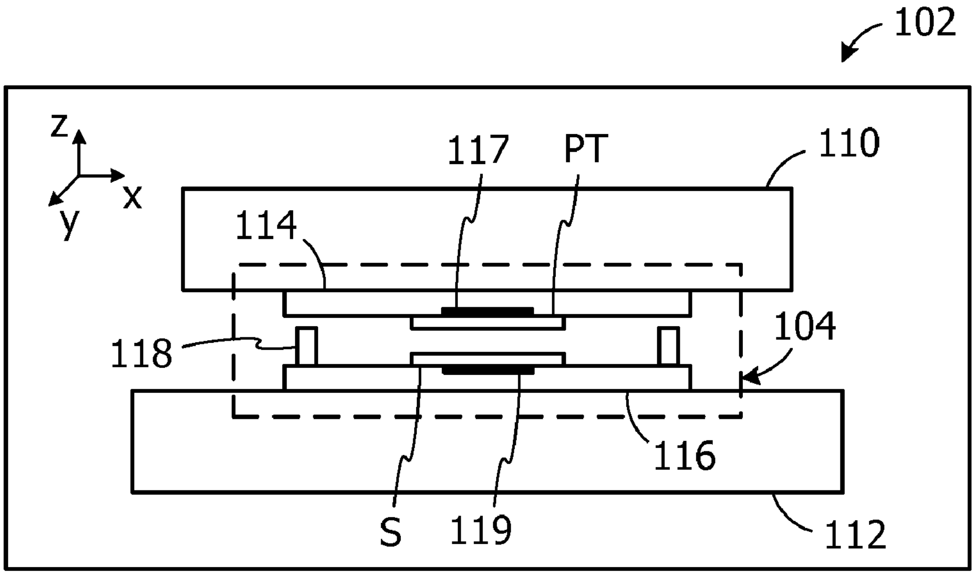
FIG. 2 is a block diagram of a pattern tool aligner in accordance with one embodiment of a present invention.

As illustrated for example in FIGS. 1A and 2, an exemplary contact lithography system 100*a* includes a pattern tool aligner 102, a contact lithography module 104 and a radiation source 106. Other exemplary contact lithography systems are represented by reference numerals 100*b* and 100*c* in FIGS. 1B and 1C. These systems include a heat source 108 in place of (FIG. 1B), or in addition to (FIG. 1C), the radiation source 106. The pattern tool aligner 102 and contact lithography module 104, as well as the other exemplary pattern tool aligners and contact lithography modules described below, are used to establish contact between a pattern tool and material on the substrate through the use of deformation processes. In addition, and as also described below, one or more of a contact lithography module, a pattern tool and a substrate may be provided with a strain control region to prevent deformation-related misalignment between the pattern tool and substrate.

The exemplary pattern tool aligner 102 illustrated in FIG. 2, which holds the contact lithography module 104 during lateral/rotational alignments and subsequent patterning, includes a pattern tool armature 110 and a substrate chuck, platen, or stage (collectively herein "substrate chuck") 112. The pattern tool aligner 102 may include many of the parts found in conventional pattern tool aligners that have a pattern tool armature and a substrate chuck. For example, the pattern tool armature 110 and the substrate chuck 112 are movable relative to one another to enable relative lateral and rotational alignments, such as lateral (X-Y) alignment and/or angular (ω) alignment, of a pattern tool and a substrate. In addition, the relative motion between the pattern tool armature 110 and the substrate chuck 112 that is conventionally employed to achieve a pattern-transferring contact between the tool and the substrate is also employed in the illustrated embodiments of the present invention. However, in the illustrated embodiments, the pattern tool aligner 102 holds or supports the contact lithography module 104 in the manner described below and relative motion is employed to close the contact lithography module, but not to bring the pattern tool and substrate into contact with one another. Such contact occurs as a result of deformation of one or more of the contact lithography module, the pattern tool and the substrate. This is also true with respect to the pattern tool aligners 102*a*-102*c* and contact lithography modules 104*a*-104*c* associated with the other embodiments.

The exemplary contact lithography module 104 illustrated in FIG. 2 includes a pattern tool carrier 114, a substrate carrier 116 and spacers 118. The pattern tool carrier 114 carries a pattern tool PT (such as a mask or a mold) and the substrate carrier carries a substrate S. To that end, adhesive, mechanical fasteners, a vacuum, and/or electromagnetic (or similar) force applicators may be used to perform the function of removably affixing the pattern tool PT to the pattern tool carrier 114. These structures are generically represented by element 117 in FIG. 2, and are omitted from the other Figures in order to insure that the other aspects of the pattern tool carrier 114 are clearly visible. Similarly, adhesive, mechanical fasteners, a vacuum, and/or electromagnetic (or similar) force applicators may be used to perform the function of removably affixing the substrate S to the substrate carrier 116. These structures are generically represented by element 119 in FIG. 2, and are omitted from the other Figures in order to insure that the other aspects of the substrate carrier 116 are clearly visible. The spacers 118 are positioned between the pattern tool carrier 114 and the substrate carrier 116, typically outside of the area where the pattern tool PT and the substrate S are located. The spacers 118 are all of essentially uniform vertical spacing dimension (such as height or diameter). Thus, when the pattern tool carrier 114 and/or the substrate carrier 116 is brought in contact with the spacers 118, the pattern tool carrier will be spaced apart from, and essentially parallel to, the substrate carrier. The pattern tool PT and substrate S will also be essentially parallel to one another in a spaced apart relationship by virtue of being affixed to the pattern tool carrier 114 and the substrate carrier 116.

The exemplary spacers 118 may be affixed to, or fabricated as integral parts of, the pattern tool carrier 114 and/or the substrate carrier 116. Alternatively, or in addition, the spacers 118 may be separate components that are positioned, placed, or otherwise inserted between the pattern tool carrier 114 and the substrate carrier 116 prior to closing the contact lithography module 104. The spacers 118 in the exemplary contact lithography module 104 illustrated in FIG. 2 are integral with the substrate carrier 116.

The pattern tool aligner 102 initially holds the contact lithography module 104 as two separated or spaced apart sections dictated by the relative positions of the pattern tool armature 110 and substrate chuck 112. In particular, the pattern tool carrier 114 and the affixed pattern tool PT are held by the pattern tool armature 110, while the substrate carrier 116 and the affixed substrate S held by the substrate chuck 112. When held by the pattern tool aligner 102 as spaced apart sections as is shown in FIG. 2, the contact lithography module 104 is said to be "open." The contact lithography module 104 may be "closed" by moving the pattern tool armature 110 and/or the substrate chuck 112 until the pattern tool carrier 114 and the substrate carrier 116 are, to the extent that they are not already integral with or secured to the spacers 118, in contact with the spacers. At this point, the pattern tool PT and substrate S will separated by a small space.

The pattern tool PT and the substrate S may be aligned when the contact lithography module 104 is closed through conventional operation of the pattern tool aligner 102, i.e. lateral and/or rotational movement of the pattern tool carrier 114 and/or the substrate carrier 116 caused by the pattern tool armature 110 and substrate chuck 112. The relative motion is provided by sliding a surface of the pattern tool carrier 114 and/or the substrate carrier 116 on the spacers 118, which maintain the essentially parallel relationship between the pattern tool carrier 114 and the substrate carrier 116 during alignment. Once aligned, contact between the pattern tool PT and substrate S is provided by deformation of the pattern tool carrier 114 and/or the substrate carrier 116 as is discussed below with reference to FIGS. 3A-10B. Alternatively, are discussed below with reference to FIGS. 11A-14B, in those instances where deformable pattern tools and/or deformable substrates are employed, a deforming force may be applied thereto in order to achieve contact between the pattern tool and substrate. The pattern process may proceed once the pattern tool PT and substrate S are in contact with one another.

The particulars of the actual patterning process will, of course, depend on the type of contact lithography system. The exemplary contact lithography system 100*a* illustrated in FIG. 1A is a photographic contact lithography system which includes the radiation source 106 that irradiates a photosensitive layer (e.g. a photoresist layer) on the substrate S. Suitable radiation sources include, but are not limited to, infrared, visible, and/or UV light sources and X-ray sources. The pattern tool carrier 114 and the pattern tool PT may be essentially transparent to light or X-ray to facilitate the exposure of the photosensitive layer on the substrate S through the pattern tool PT. The pattern tool carrier 114 may, alternatively, have an opening while the pattern tool PT is transparent. In other exemplary photolithographic systems, the substrate carrier 116 and the substrate S may be essentially transparent to light or X-ray. The substrate carrier 116 may, alternatively, have an opening while the substrate S is transparent. In still other exemplary systems, the pattern tool carrier 114 and the substrate carrier 116 may both be essentially transparent to light or have an opening. The actual location of the radiation source (or sources) 106 will depend on the manner in which the photosensitive layer is to be exposed to radiation.

Turning to FIG. 1B, the exemplary contact lithography system 100*b* is an imprint lithography system. Here, a moldable layer on the substrate S may be cured using heat while the pattern tool molds the moldable layer. The heat is supplied by the heat source 108. Alternatively, the moldable layer may be softened using heat from the heat source 108 followed by cooling while the pattern tool molds the moldable layer. The exemplary contact lithography system 100*c* illustrated in FIG. 1C includes the radiation source 106 and the heat source 108. Such a system is capable of heat curing/softening and photo-curing/softening a moldable layer during imprint lithography and photo-exposure during photolithography.

As noted above, strain control regions may be used to prevent deformation-related misalignment between the pattern tool and substrate. A "strain control region" is an area, or a plurality of spaced or connected areas, of the associated structure that is more flexible than other areas of the associated structure. Strain control regions may be employed in one or more of a contact lithography module, a pattern tool and a substrate.

Figure 3A:
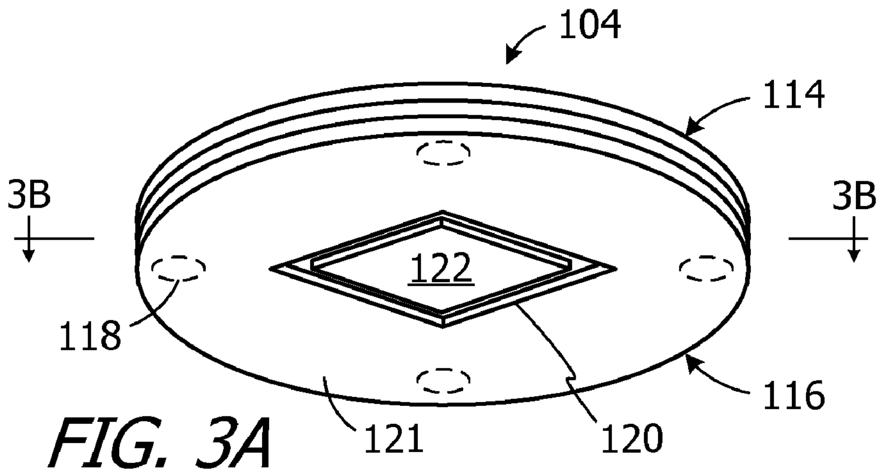
FIG. 3A is a perspective view of a contact lithography module in accordance with one embodiment of a present invention.
Figure 3B:
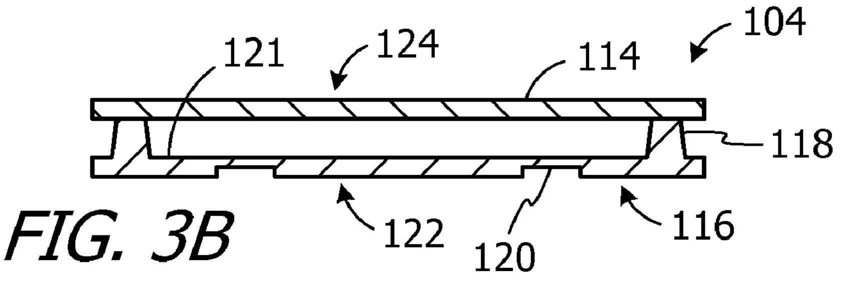
FIG. 3B is a section view taken along line 3B-3B in FIG. 3A.

Referring first to contact lithography modules, and as illustrated in FIGS. 3A and 3B, the exemplary substrate carrier 116 in the contact lithography module 104 includes a strain control region 120. The exemplary strain control region 120 is a region of reduced thickness and increased flexibility in the substrate carrier main body 121 that extends around the substrate mounting portion 122 of the substrate carrier 116. The exemplary strain control region 120 is also located between the spacers 118 and the substrate mounting portion 122. In this particular embodiment, the pattern tool carrier 114 does not include a strain control region.

Figure 4A:
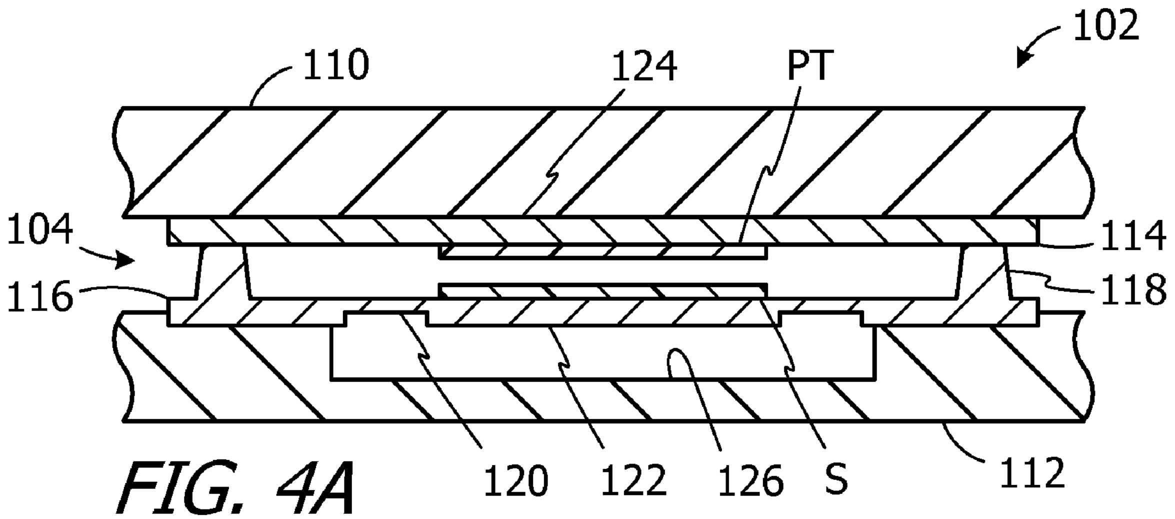
FIGS. 4A and 4B are section views showing the contact lithography module illustrated in FIGS. 3A and 3B being used to bring a pattern tool and a substrate into contact with one another.
Figure 4B:
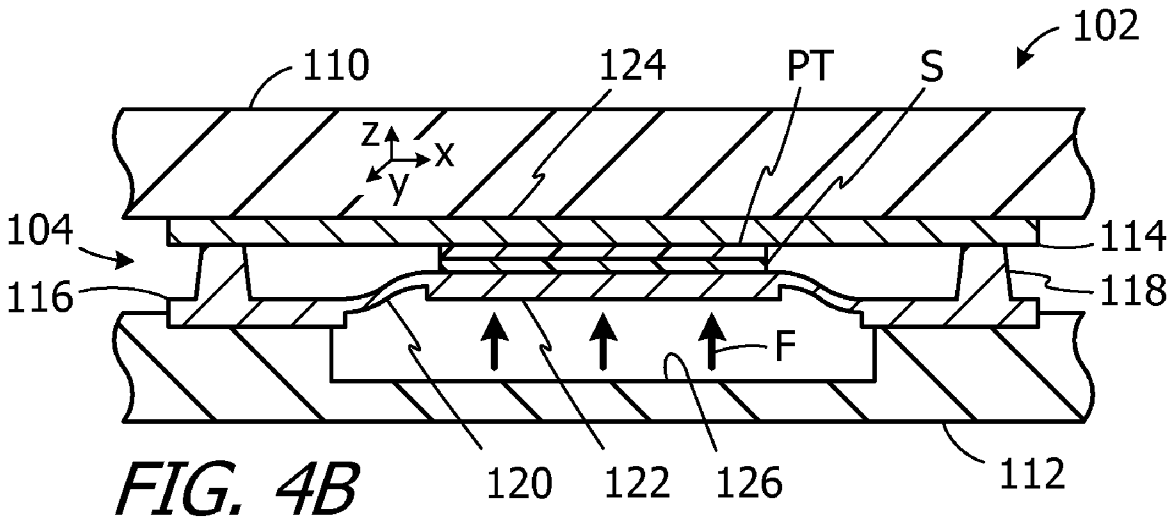

The exemplary substrate carrier 116 may be used to bring the substrate S into contact with the pattern tool PT in the exemplary manner illustrated in FIGS. 4A and 4B. Referring first to FIG. 4A, the pattern tool aligner 102 is shown in the closed orientation holding the contact lithography module 104, which is itself carrying the pattern tool PT and substrate S. The presence of the spacers 118 results in a small space between the pattern tool PT and substrate S. The substrate S is brought into contact with pattern tool PT by deforming the substrate carrier 116. More specifically, and turning to FIG. 4B, the substrate chuck 112 applies a force F to the substrate carrier 116 in order to deform the substrate carrier to the extent that the substrate mounting portion 122 comes into extremely close proximity to the pattern tool mounting portion 124 and the substrate S contacts the pattern tool PT with the desired level of contact pressure between the substrate and pattern tool. The applied force F may in the form of, but is not limited to, hydrostatic force, mechanical force (such as piezoelectric force), electromagnetic force (such as static and/or dynamic electric and/or magnetic force), and acoustic force (such as an acoustic wave and/or acoustic shock). In the illustrated embodiment, hydrostatic force is applied in the Z-direction to the substrate carrier 116 by way of an opening 126 in the substrate chuck 112.

Figure 5A:
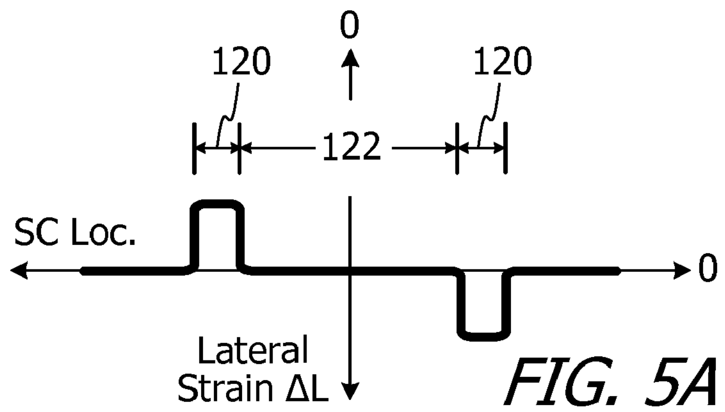
FIG. 5A is a graph showing the lateral strain on the substrate carrier illustrated in FIG. 4B.
Figure 5B:
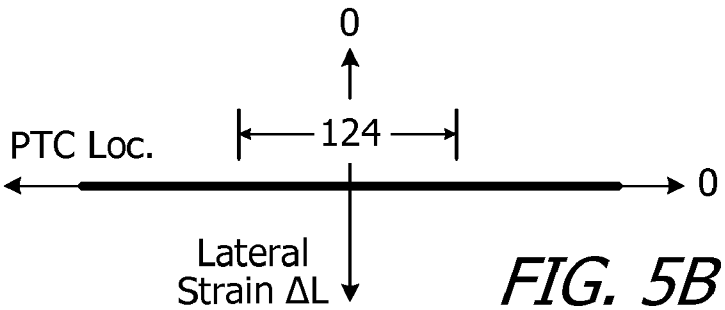
FIG. 5B is a graph showing the lateral strain on the pattern tool carrier illustrated in FIG. 4B.
Figure 5C:
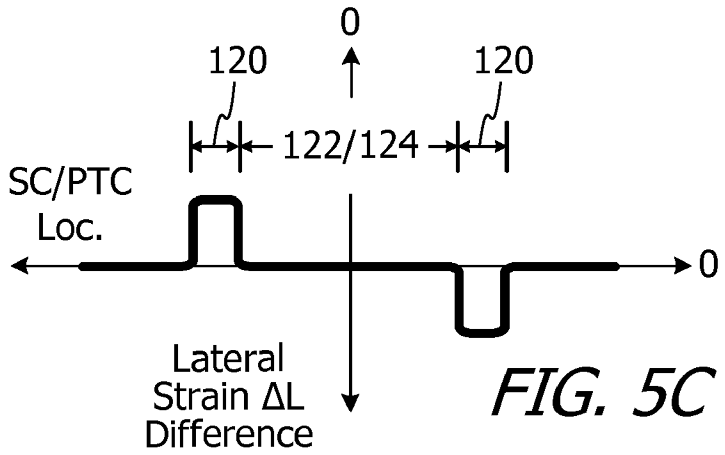
FIG. 5C is a graph showing the difference in the lateral strain on the substrate carrier and the pattern tool carrier illustrated in FIG. 4B.
Figure 5D:
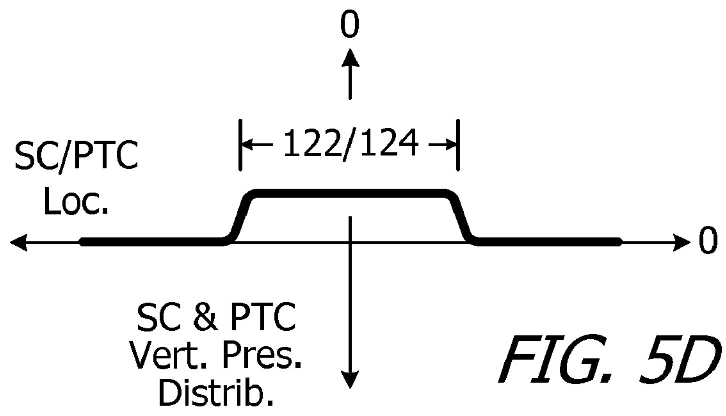
FIG. 5D is a graph showing the vertical pressure distribution on the substrate carrier and the pattern tool carrier illustrated in FIG. 4B.

Some of the beneficial effects of concentrating strain within the strain control region 120 when the substrate carrier 116 is deformed, for example in the manner illustrated in FIG. 4B, are graphically illustrated in FIGS. 5A-5D. FIG. 5A is a graph showing the lateral strain (ΔL) in the substrate carrier 116 when it is deformed to the extent that the substrate S is in contact with the pattern tool PT. The lateral strain is localized in the strain control region 120 and there is essentially no strain in the remainder of the substrate carrier 116. Most notably, there is essentially no strain in the substrate mounting portion 122. The strain control region 120, therefore, performs the function of concentrating deformation-related strain in a portion of the substrate carrier 116 in spaced relation to the substrate mounting portion 122. There is also no strain in the pattern tool carrier 114, including the pattern tool mounting portion 124, when the substrate S is in contact with the pattern tool PT. This lack of strain, which is due to the fact that the pattern tool carrier 114 is not deformed, is graphically illustrated in FIG. 5B. The difference in strain in the pattern tool carrier 114 and substrate carrier 116 is illustrated in FIG. 5C. Although there is a strain differential at the strain control region 120 and the portions of the pattern tool carrier 114 aligned therewith, the strain differential at the substrate mounting portion 122 and the pattern tool mounting portion 124 is essentially zero. As a result, the alignment of the substrate S and pattern tool PT that was achieved by the pattern tool aligner 102 prior to deformation of the pattern tool carrier 114 will not be degraded. Additionally, due to the absence of strain in the substrate mounting portion 122, the substrate S will not be distorted during the deformation of the substrate carrier 116. The distortions in the pattern imparted by the pattern tool PT that are due to distortions of the substrate S will, therefore, also be avoided. Turning to FIG. 5D, another beneficial result of the absence of strain in the substrate carrier 116 is a uniform pressure distribution across the substrate S and pattern tool PT. Non-uniform pressure distribution can adversely impact lithographic results in a number of ways including, but not limited to, non-uniform thickness of the residual photosensitive material in a photolithographic process.

The exemplary substrate carrier 116 may be formed by any suitable method. For example, spacers 118 that are integral to the substrate carrier 116 may be formed by depositing or growing a material layer on a surface of the substrate carrier. For example, a silicon dioxide ($SiO_2$) layer may be either grown or deposited on a surface of a silicon (Si) substrate carrier. Selective etching of the deposited or grown $SiO_2$ layer may be employed to define shape of the spacers 118. Uniform spacer height may established by virtue of simultaneous growth or deposition of the spacers 118 through the use of, for example, an evaporative material deposition process. Alternatively, or in addition, post-processing of the grown and/or deposited spacers 118, such as micromachining, may be employed. The spacers 118 may also be separately fabricated and then affixed to substrate carrier 116 using glue, epoxy or other suitable means for joining. Additionally, although four (4) spacers 118 are shown for ease of illustration, the actual number of spacers may be increased or decreased as desired. A single ring-shaped spacer could also be employed.

Figure 6A:
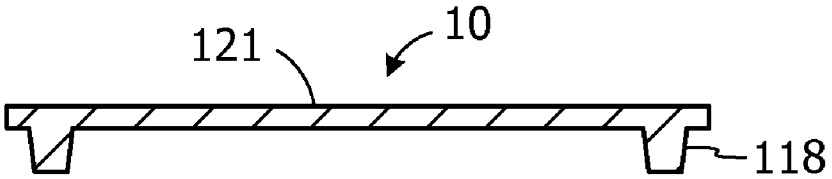
FIGS. 6A and 6B are section views showing an exemplary method of making a substrate carrier in accordance with one embodiment of a present invention.
Figure 6B:
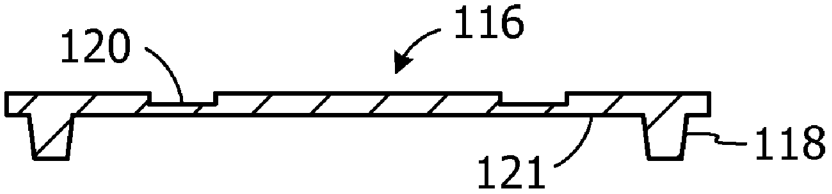
Figure 7A:
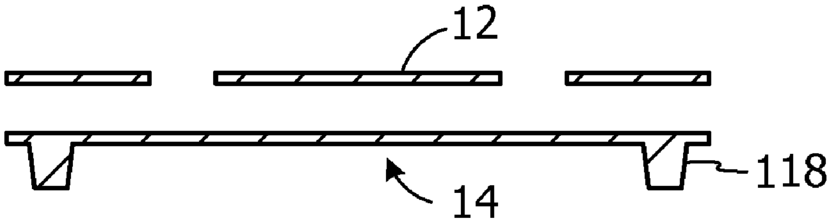
FIGS. 7A and 7B are section views showing an exemplary method of making a substrate carrier in accordance with one embodiment of a present invention.
Figure 7B:
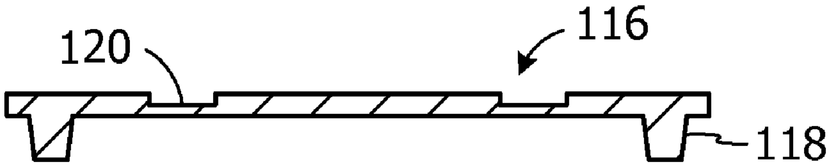
Figure 8A:
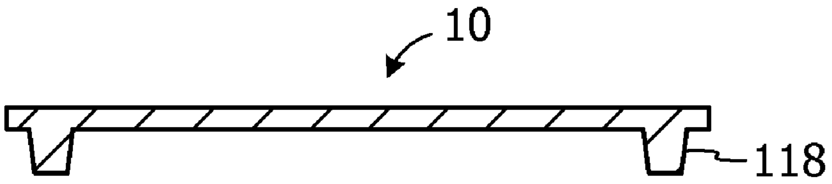
FIGS. 8A and 8B are section views showing an exemplary method of making a substrate carrier in accordance with one embodiment of a present invention.
Figure 8B:
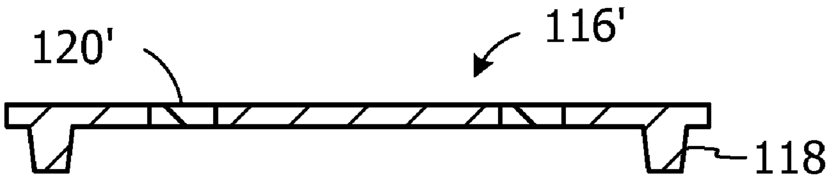

Turning to the strain control region 120, and referring first to FIGS. 6A and 6B, the strain control region may be formed by etching or otherwise removing material from the main body 121 of a partially completed substrate carrier 10 to complete the substrate carrier 116. Alternatively, the strain control region 120 may be formed by selectively adding material 12 to a partially completed substrate carrier 14 to complete the substrate carrier 116, as is shown in FIGS. 7A and 7B. In other words, regions of the partially completed substrate carrier that will not form the strain control region 120 are stiffened by increasing their thickness. The stiffening material may be the same as, or different than, the material used to form the partially completed substrate carrier. Other methods involve treating portions of a partially completed substrate carrier to form a substrate carrier with a strain control region. As illustrated for example in FIGS. 8A and 8B, the region of a partially completed substrate carrier 10 that will ultimately form the strain control region 120' may be chemically treated so as to make that region more flexible than the remainder of the completed substrate carrier 116'. Alternatively, the other regions may be chemically treated so as to increase their thicknesses. Still other suitable methods include, but are not limited to, implanting, annealing, other types of chemical functionalization, and any combination of the techniques described herein.

It should also be noted here that although the exemplary strain control region 120 is a single continuous area that extends completely around another area (e.g., the substrate mounting portion 122 of the substrate carrier 116), the present invention are not limited to such a configuration. For example, a strain control region may include a plurality of continuous areas of increased flexibility that extend around a particular area, a plurality or spaced areas of increased flexibility that together extend around a particular area, or any other area or combination of areas of increased or decreased flexibility that results in the desired localization of strain during deformation.

Figure 3C:
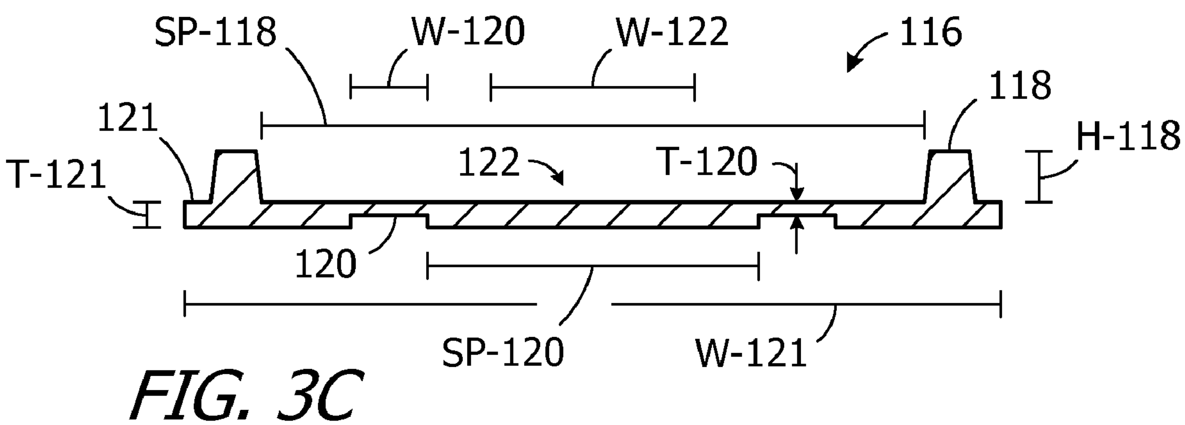
FIG. 3C is a section view of a substrate carrier in accordance with one embodiment of a present invention.

Turning to FIG. 3C, and although the present substrate carriers are not so limited, the dimensions of one exemplary implementation of a substrate carrier 116 are as follows. The width W-121 and thickness T-121 of the substrate carrier main body 121 are about 20-500 mm and about 1-10 mm, respectively. The height H-118 of the spacers 118 is about 0.1-10 μm. The substrate mounting portion width W-122 is about 10-300 mm. The strain control region thickness T-120 is about 0.01-0.50× (i.e. 0.01 to 0.50 times) the substrate carrier main body thickness T-121, and the width W-120 is about 1-50× the strain control region thickness T-120. The spacing SP-120 between horizontally spaced portions of the strain control region 120 is about 1.1-3.0× the substrate mounting portion width W-122. The spacer spacing SP-118 is about 1.1-2.0× the spacing SP-120 between horizontally spaced portions of the strain control region 120.

Figure 9A:
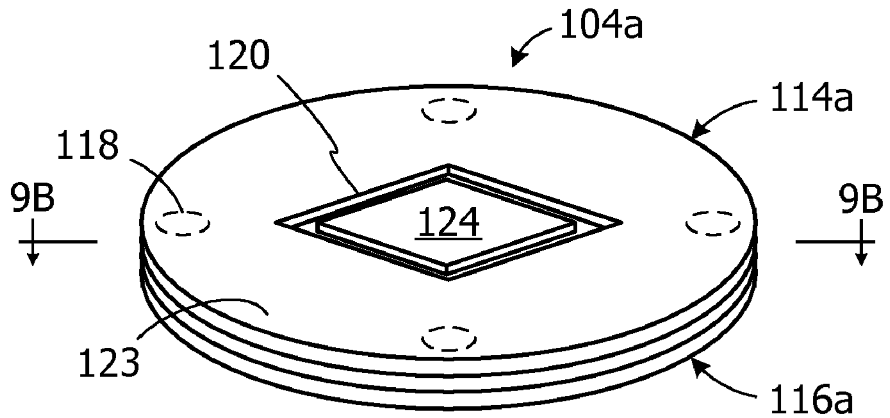
FIG. 9A is a perspective view of a contact lithography module in accordance with one embodiment of a present invention.
Figure 9B:
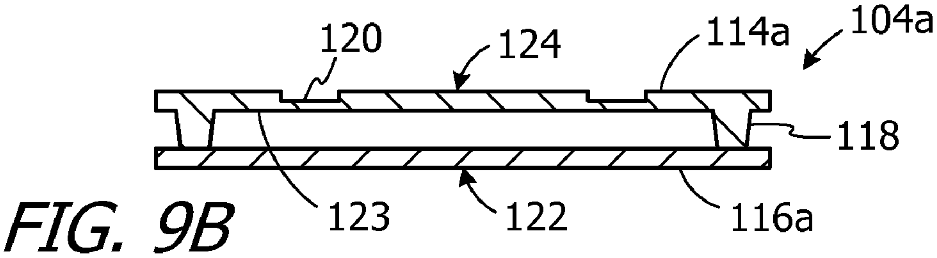
FIG. 9B is a section view taken along line 9B-9B in FIG. 9A.

Strain control regions may also be provided in pattern tool carriers. For example, the contact lithography module 104*a* illustrated in FIGS. 9A and 9B is substantially similar to the contact lithography module 104 and similar elements are represented by similar reference numerals. Here, however, the pattern tool carrier 114*a* includes a strain control region 120 that extends around the pattern tool mounting portion 124. In this particular embodiment, there is no strain control region in the substrate carrier 116*a*. Also, in this embodiment, the spacers 118 are integral with the pattern tool carrier 114*a*.

Figure 10A:
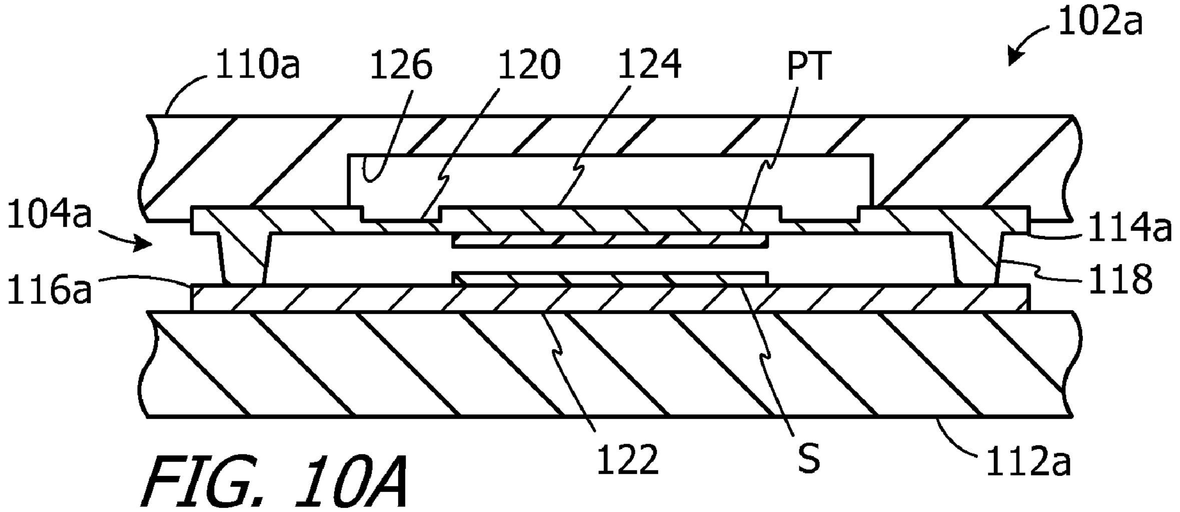
FIGS. 10A and 10B are section views showing the contact lithography module illustrated in FIGS. 9A and 9B being used to bring a pattern tool and a substrate into contact with one another.
Figure 10B:
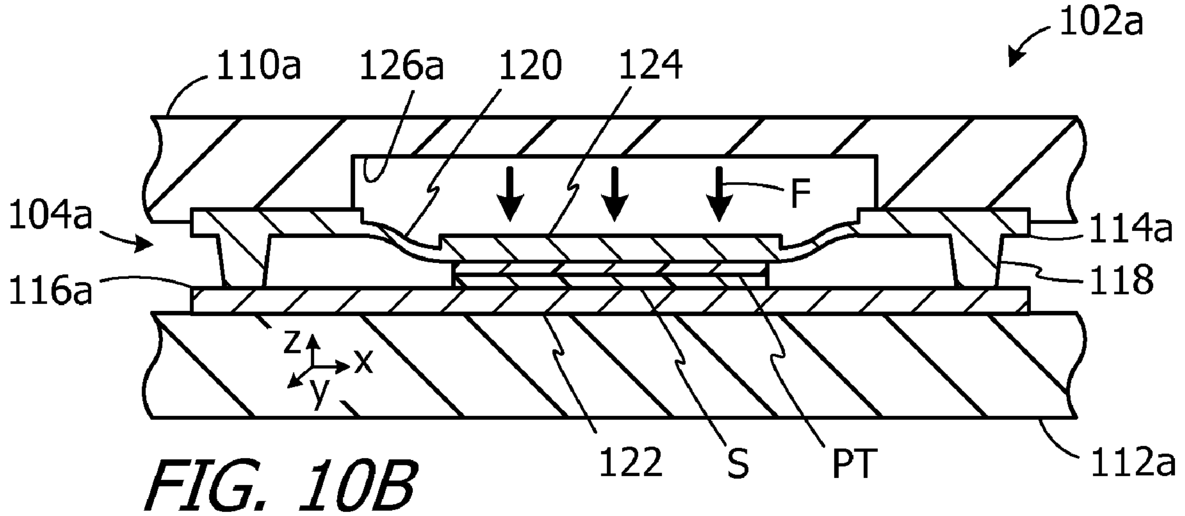

The pattern tool carrier 114*a* may be used, for example in conjunction with the exemplary pattern tool aligner 102*a* illustrated in FIGS. 10A and 10B, to bring the pattern tool PT into contact with the substrate S. The exemplary pattern tool aligner 102*a* illustrated in FIGS. 10A and 10B is substantially similar to the pattern tool aligner 102 and similar elements are represented by similar reference numerals. To that end, the pattern tool aligner 102*a* includes a pattern tool armature 110*a*, which carries the pattern tool carrier 114*a*, and a substrate chuck 112*a*, which carries a substrate carrier 116*a*. The pattern tool aligner 102*a* is shown in the closed orientation holding the contact lithography module 104*a*, which is itself carrying the pattern tool PT and substrate S. The presence of the spacers 118 results in a small space between the pattern tool PT and substrate S. The pattern tool PT is brought into contact with the substrate S by deforming the pattern tool carrier 114*a*. More specifically, and referring to FIG. 10B, the pattern tool armature 110*a* applies a force F to the pattern tool carrier 114*a* in order to deform the pattern tool carrier to the extent that the pattern tool mounting portion 124 comes into extremely close proximity to the substrate mounting portion 122, and the pattern tool PT contacts the substrate S with the desired level of contact pressure between the pattern tool and substrate. The applied force F may in the form of, but is not limited to, hydrostatic force, mechanical force (such as piezoelectric force), electromagnetic force (such as static and/or dynamic electric and/or magnetic force), and acoustic force (such as an acoustic wave and/or acoustic shock). In the illustrated embodiment, hydrostatic force is applied in the Z-direction to the pattern tool carrier 114*a* by way of an opening 126*a* in the pattern tool armature 110*a*.

The beneficial effects of concentrating strain within the strain control region 120 when the pattern tool carrier 114*a* is deformed are essentially the same as those discussed above in the context of the substrate carrier 116 and FIGS. 5A-5D. For example, the lateral strain in the pattern tool carrier 114*a* is localized in the strain control region 120 when pattern tool carrier is deformed to the extent that the pattern tool PT is in contact with the substrate S. There is essentially no strain in the remainder of the pattern tool carrier 114*a* including, most notably, the pattern tool mounting portion 124. The strain control region 120, therefore, performs the function of concentrating deformation-related strain in a portion of the pattern tool carrier 114*a* in spaced relation to the pattern tool mounting portion 124. There is also no strain in the substrate carrier 112*a*, including the substrate mounting portion 122, when the pattern tool PT is in contact with the substrate S because the substrate carrier is not deformed. Thus, although there is a lateral strain differential at the strain control region 120 and the portions of the substrate carrier 112*a* aligned therewith, the strain differential at the substrate mounting portion 122 and the pattern tool mounting portion 124 is essentially zero. As a result, the alignment of the substrate S and pattern tool PT that was achieved by the pattern tool aligner 102*a* prior to deformation of the pattern tool carrier 114*a* will not be degraded during deformation of the pattern tool carrier. Additionally, due to the absence of strain in the pattern tool mounting portion 124, the pattern tool PT will not be distorted during the deformation of the pattern tool carrier 114*a* and the distortions in the imprinted pattern associated with pattern tool distortion will be avoided. The absence of strain in the pattern tool carrier 114*a* also results in uniform pressure distribution across the substrate S and pattern tool PT, thereby preventing non-uniform thickness of residual photosensitive material in a photolithographic process, as well as other adverse consequences of non-uniform pressure distribution.

The exemplary pattern tool carrier 114*a* may be formed by any suitable method, including those described above with respect to the manufacture of the substrate carrier 116. For example, the integral spacers 118 may be formed by depositing or growing a material layer on a surface of the pattern tool carrier and selective etching of the material layer may be employed to define shape of the spacers 118. Post-processing of the spacers 118, such as micromachining, may be employed. The spacers 118 may also be separately fabricated and then affixed to the pattern tool carrier 114*a* using glue, epoxy or other suitable means for joining. The strain control region 120 may be formed by etching or otherwise removing material from the main body 123 of a partially completed pattern tool carrier where the strain control region will be located, or by selectively adding material to other areas of a partially completed substrate carrier. Other methods involve chemically treating the region of a partially completed substrate carrier 10 that will ultimately form the strain control region to increase its flexibility, or chemically decreasing the flexibility of other regions. Processes such as implanting, annealing, and other types of chemical functionalization, as well as any combination of the techniques described herein, may also be employed.

Figure 9C:
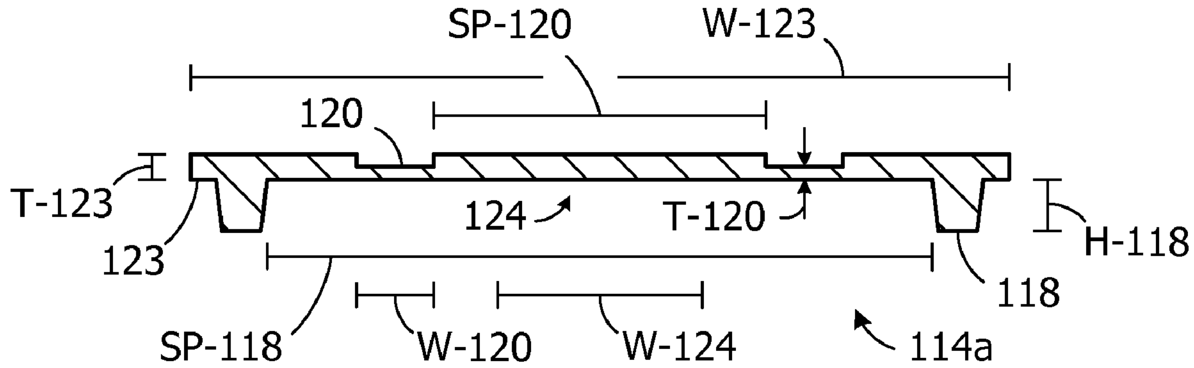
FIG. 9C is a section view of a pattern tool carrier in accordance with one embodiment of a present invention.

Turning to FIG. 9C, and although the present pattern tool carriers are not so limited, the dimensions of one exemplary implementation of a pattern tool carrier 114*a* are as follows. The width W-123 and thickness T-123 of the pattern tool carrier main body 123 are about 20-500 mm and about 1-10 mm, respectively. The height H-118 of the spacers 118 is about 0.1-10 μm. The pattern tool mounting portion width W-124 is about 10-300 mm. The strain control region thickness T-120 is about 0.01-0.50× (i.e. 0.01 to 0.50 times) the pattern tool carrier main body thickness T-123, and the width W-120 is about 1-50× the strain control region thickness T-120. The spacing SP-120 between horizontally spaced portions of the strain control region 120 is about 1.1-3.0× the pattern tool mounting portion width W-124. The spacer spacing SP-118 is about 1.1-2.0× the spacing SP-120 between horizontally spaced portions of the strain control region 120.

It should also be noted here that the contact lithography modules with strain control are not limited the embodiments described above. By way of example, in some embodiments, the substrate carrier and the pattern tool carrier will both include a strain control region. Additionally, in those instances where only one of the substrate carrier and the pattern tool carrier include a strain control region, the spacers may be provided on the other of the substrate carrier and the pattern tool carrier. The spacers may also be separate elements that are interposed between the substrate carrier and pattern tool carrier.

Figure 11A:
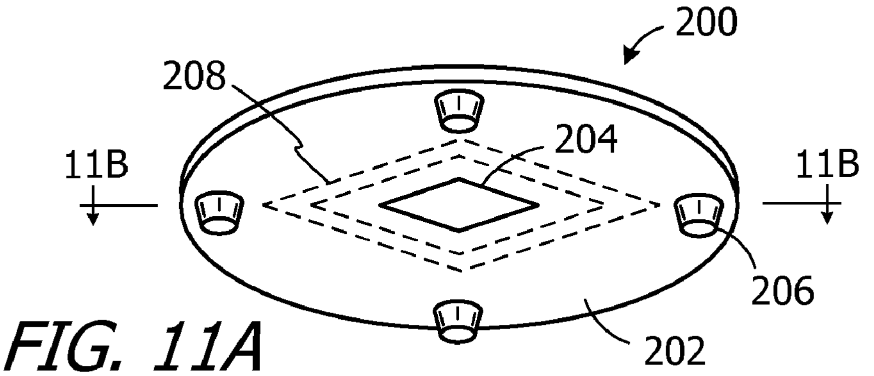
FIG. 11A is a perspective view of a pattern tool in accordance with one embodiment of a present invention.
Figure 11B:
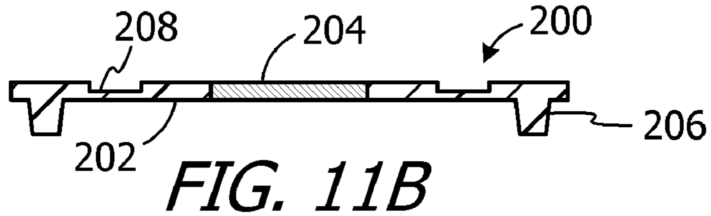
FIG. 11B is a section view taken along line 11B-11B in FIG. 11A.

Strain control may also be applied to pattern tools. Referring first to FIGS. 11A and 11B, an exemplary pattern tool 200 includes a main body 202, a pattern area 204 (such as a photomask or a mold) with a lithographic pattern and a plurality of spacers 206. The exemplary pattern tool 200 includes also includes a strain control region 208 that is formed in the main body 202. The exemplary strain control region 208 extends around the pattern area 204.

Figure 12A:
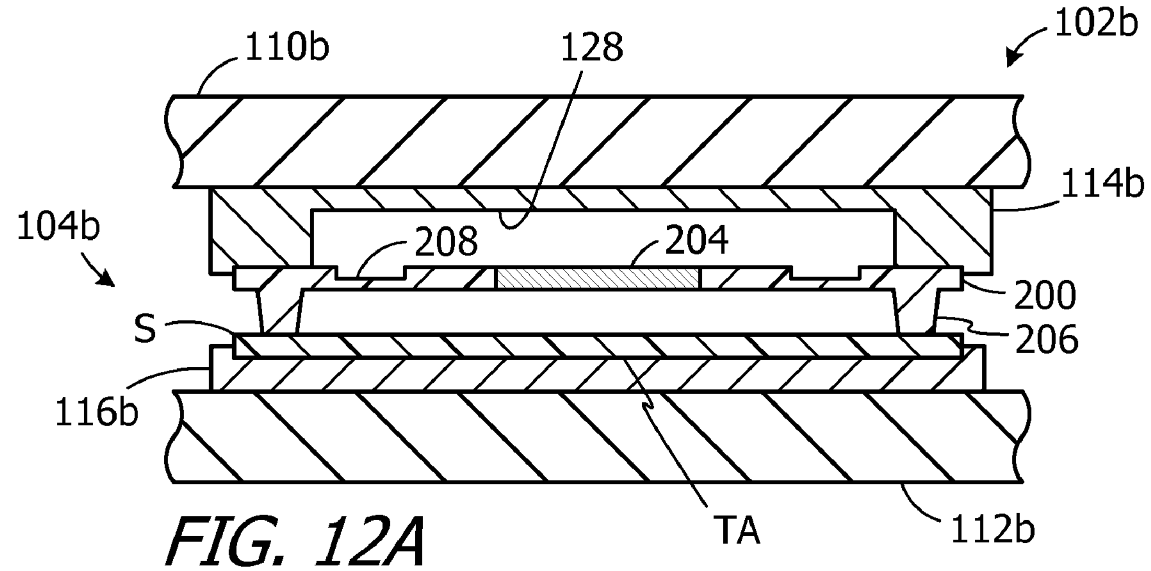
FIGS. 12A and 12B are section views showing the pattern tool illustrated in FIGS. 11A and 11B being brought into contact with a substrate.
Figure 12B:
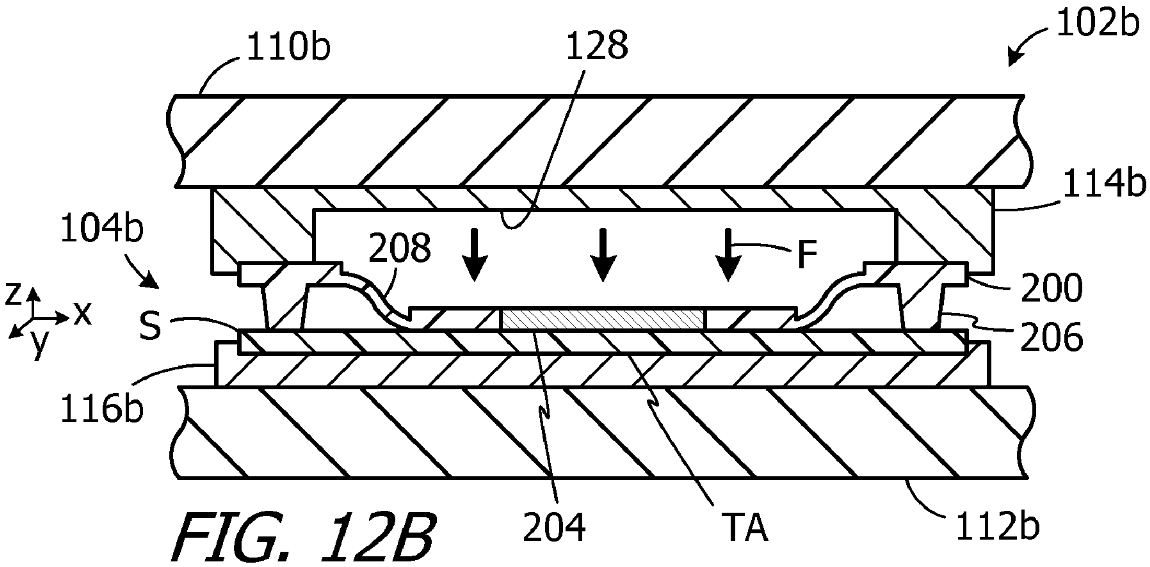

The pattern tool aligner 102*b* illustrated in FIGS. 12A and 12B is one example of a device that may be used may be used to bring the pattern area 204 into contact with the target area TA of a substrate S. The pattern tool aligner 102*b* is substantially similar to the pattern tool aligner 102 and similar elements are represented by similar reference numerals. For example, the pattern tool aligner 102*b* includes a pattern tool armature 110*b*, which carries the pattern tool carrier 114*b*, and a substrate chuck 112*b*, which carries a substrate carrier 116*b*. Here, however, the pattern tool carrier 114*b* is configured to deform the pattern tool 200 by applying a force F thereto. The applied force F may in the form of, but is not limited to, hydrostatic force, mechanical force (such as piezoelectric force), electromagnetic force (such as static and/or dynamic electric and/or magnetic force), and acoustic force (such as an acoustic wave and/or acoustic shock). In the illustrated embodiment, hydrostatic force is applied in the Z-direction to the pattern tool 200 by way of an opening 128 in the pattern tool carrier 114*b*.

The pattern tool aligner 102*b* is shown in the closed orientation in FIGS. 12A and 12B holding the contact lithography module 104*b*, which is itself carrying the pattern tool 200 and substrate S. Although the pattern tool 200 is in contact with the substrate S, the presence of the spacers 206 results in a small space between the pattern area 204 and substrate target area TA. The pattern area 204 is brought into contact with the substrate target area TA through deformation of the pattern tool 200 achieved by applying the downward force F to the pattern tool, thereby causing the pattern tool to deform in the manner illustrated in FIG. 12B and the pattern area to contact the target area TA.

The beneficial effects of concentrating strain within the strain control region 208 when the pattern tool 200 is deformed are essentially the same as those discussed above in the context of the pattern tool carrier 114*a*. For example, the lateral strain in the pattern tool 200 is localized in the strain control region 208 when pattern tool is deformed. There is essentially no strain in the remainder of the pattern tool 200 including, most notably, the pattern area 204. The strain control region 208, therefore, performs the function of concentrating deformation-related strain in a portion of the pattern tool 200 in spaced relation to the pattern area 204. There is also no strain in the substrate S, including the target area TA, because the substrate is not deformed. Thus, although there is a lateral strain differential at the strain control region 208 and the portions of the substrate S aligned therewith, the strain differential at the substrate target area TA and the pattern area 204 is essentially zero. As a result, the alignment of the substrate target area TA and pattern area 204 that was achieved by the pattern tool aligner 102*b* prior to deformation of the pattern tool 200 will not be degraded during deformation. Additionally, due to the absence of strain in the pattern area 204 during deformation of the pattern tool 200, the pattern area will not be distorted and corresponding distortions in the imprinted pattern will be avoided. The absence of strain in the pattern area 204 also results in uniform pressure distribution across the substrate target area TA and pattern area, thereby preventing non-uniform thickness of residual photosensitive material in a photolithographic process, as well as other adverse consequences of non-uniform pressure distribution.

The exemplary pattern tool 200 may be formed by any suitable method, including those described above with respect to the manufacture of the pattern tool carrier 114*a* and the substrate carrier 116. For example, the integral spacers 206 may be formed on, or separately formed and secured to, the pattern tool by the methods described above. The spacers may also be omitted from the pattern tool 200 and, alternatively, be included on the associated substrate or be separate structural elements. The strain control region 208 may be formed by etching or otherwise removing material from the main body 202 of a partially completed pattern tool, or by selectively adding material to the main body of a partially completed pattern tool. Other methods involve chemically treating the main body of a partially completed pattern tool in order to increase the flexibility of the region that will form the strain control region, or increase the stiffness of the areas that will not form the strain control region. Processes such as implanting, annealing, and other types of chemical functionalization, as well as any combination of the techniques described herein, may also be employed.

Figure 11C:
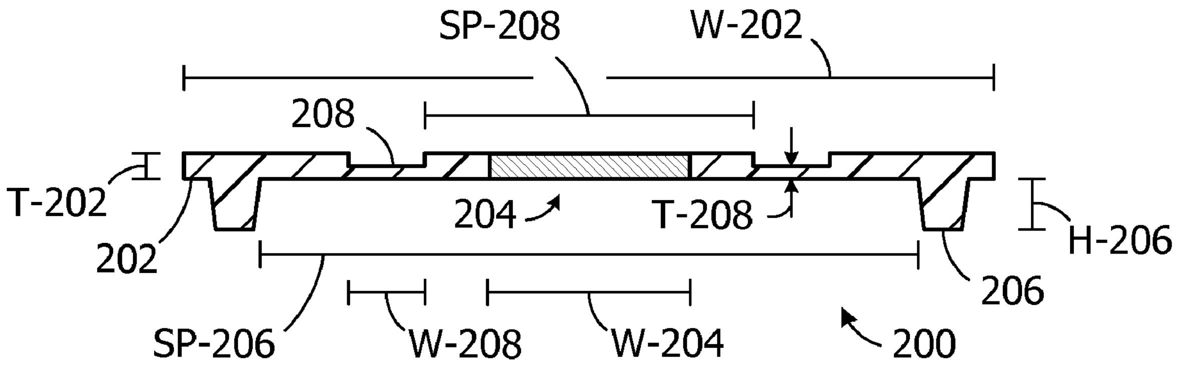
FIG. 11C is a section view of a pattern tool in accordance with one embodiment of a present invention.

Turning to FIG. 11C, and although the present pattern tools are not so limited, the dimensions of one exemplary implementation of a pattern tool 200 are as follows. The width W-202 and thickness T-202 of the pattern tool main body 202 are about 10-300 mm and about 0.1-5.0 mm, respectively. The height H-206 of the spacers 206 is about 0.1-10 μm. The pattern area width W-204 is about 1-100 mm. The strain control region thickness T-208 is about 0.01-0.50× (i.e. 0.01 to 0.50 times) the pattern tool main body thickness T-202, and the width W-208 is about 1-50× the strain control region thickness T-208. The spacing SP-208 between horizontally spaced portions of the strain control region 208 is about 1.1-3.0× the pattern area width W-204. The spacer spacing SP-206 is about 1.1-2.0× the spacing SP-208 between horizontally spaced portions of the strain control region 208.

Figure 13A:
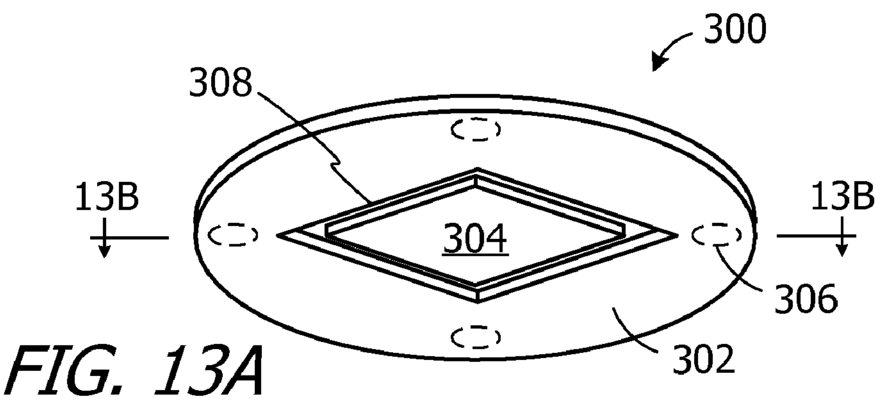
FIG. 13A is a perspective view of a substrate in accordance with one embodiment of a present invention.
Figure 13B:
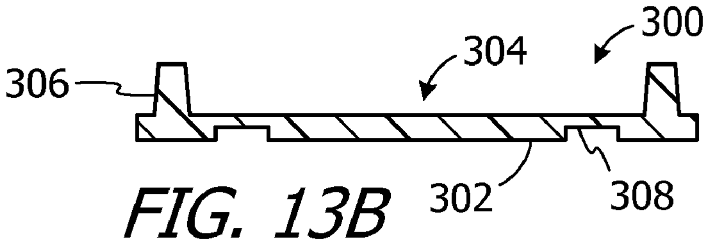
FIG. 13B is a section view taken along line 13B-13B in FIG. 13A.

Strain control may also be applied to substrates. One example of such a substrate is illustrated in FIGS. 13A and 13B. Here, the substrate 300 includes a main body 302, a target area 304 that will be contacted by a pattern tool (e.g. a photomask or mold) and a plurality of spacers 306. The exemplary substrate 300 also includes a strain control region 308 that is formed in the main body 302 and extends around the target area 304.

Figure 14A:
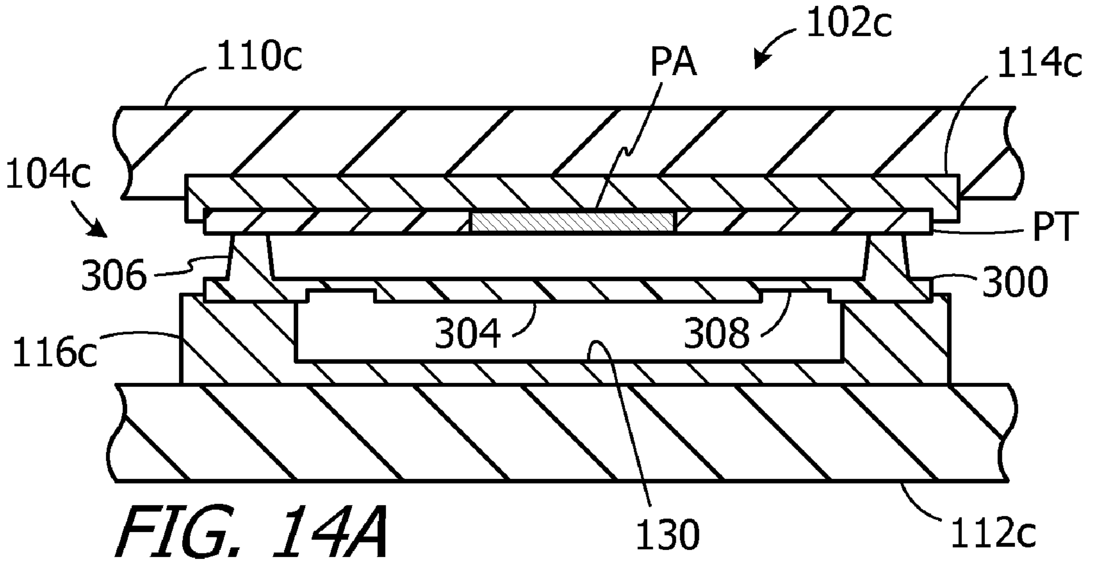
FIGS. 14A and 14B are section views showing the substrate illustrated in FIGS. 13A and 13B being brought into contact with a pattern tool.
Figure 14B:
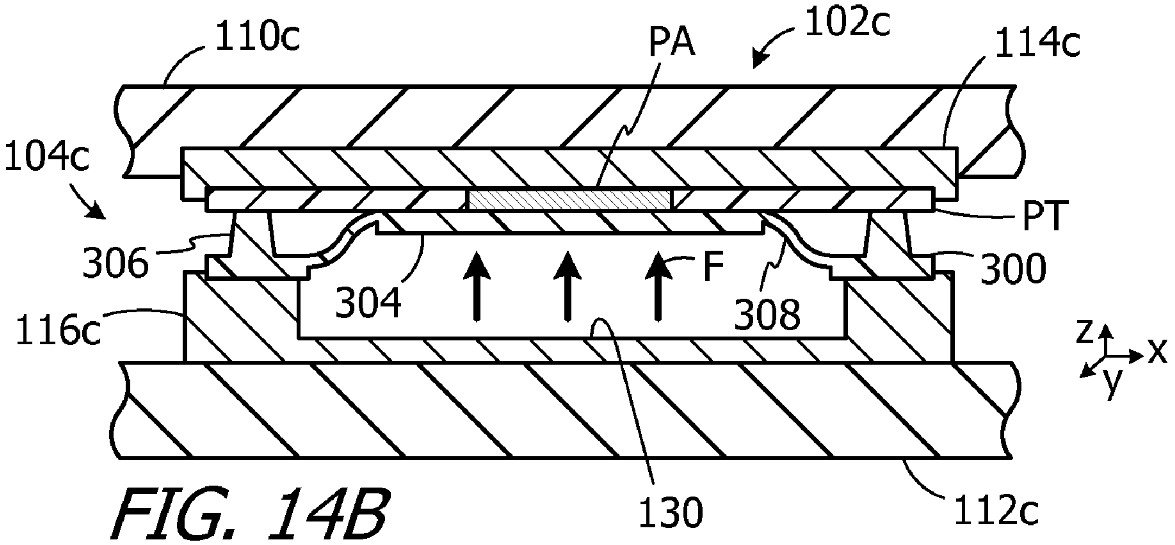

The pattern tool aligner 102*c* illustrated in FIGS. 14A and 14B is one example of a device that may be used may be used to bring the target area 304 of the substrate 300 into contact with the pattern area PA of a pattern tool PT. The pattern tool aligner 102*c* is substantially similar to the pattern tool aligner 102 and similar elements are represented by similar reference numerals. For example, the pattern tool aligner 102*c* includes a pattern tool armature 110*c*, which carries the pattern tool carrier 114*c*, and a substrate chuck 112*c*, which carries a substrate carrier 116*c*.

The target area 304 of the exemplary substrate 300 may be brought into contact with the pattern area PA of the pattern tool PT in the exemplary manner illustrated in FIGS. 14A and 14B. Referring first to FIG. 14A, the pattern tool aligner 102*c* is shown in the closed orientation holding the contact lithography module 104*c*, which is itself carrying the pattern tool PT and substrate 300. The presence of the spacers 306 results in a small space between the pattern tool PT and substrate 300. The substrate target area 304 is brought into contact with pattern tool pattern area PA by deforming the substrate 300. More specifically, and turning to FIG. 14B, the substrate chuck 112*c* applies force F to the substrate 300 in order to deform the substrate to the extent that the substrate target area 304 contacts the pattern tool pattern area PA with the desired level of contact pressure between the two. The applied force F may be in the form of, but is not limited to, hydrostatic force, mechanical force (such as piezoelectric force), electromagnetic force (such as static and/or dynamic electric and/or magnetic force), and acoustic force (such as an acoustic wave and/or acoustic shock). In the illustrated embodiment, hydrostatic force is applied in the Z-direction to the substrate 300 by way of an opening 130 in the substrate carrier 116*c*.

The beneficial effects of concentrating strain within the strain control region 308 when the substrate 300 is deformed are essentially the same as those discussed above in the context of the substrate carrier 116. For example, the lateral strain in the substrate 300 is localized in the strain control region 308 when the substrate is deformed. There is essentially no strain in the remainder of the substrate 300 including, most notably, the target area 304. The strain control region 308, therefore, performs the function of concentrating deformation-related strain in a portion of the substrate 300 in spaced relation to the target area 304. There is also no strain in the pattern tool PT because the pattern tool is not deformed. Thus, although there is a lateral strain differential at the strain control region 308 and the portions of the pattern tool PT aligned therewith, the strain differential at the substrate target area 304 and the pattern area PA is essentially zero. As a result, the alignment of the substrate target area 304 and pattern area PA that was achieved by the pattern tool aligner 102*c* prior to deformation of the substrate 300 will not be degraded during deformation. Additionally, due to the absence of strain in the target area 304 during deformation of the substrate 300, the target area will not be distorted and distortions in the imprinted pattern will be avoided. The absence of strain in the substrate target area 304 also results in uniform pressure distribution across the target area and pattern tool pattern area PA, thereby preventing non-uniform thickness of residual photosensitive material in photolithographic processes, as well as other adverse consequences of non-uniform pressure distribution.

The exemplary substrate 300 may be formed by any suitable method, including those described above with respect to the manufacture of the pattern tool carrier 114*a*, the substrate carrier 116 and the pattern tool 200. For example, the integral spacers 306 may be formed on, or separately formed and secured to, the substrate by the methods described above. The spacers may also be omitted from the substrate 300 and, alternatively, be included on the associated pattern tool or be separate structural elements. The strain control region 308 may be formed by etching or otherwise removing material from the main body 302 of a partially completed substrate, or selectively adding material to the main body of a partially completed pattern tool. Other methods involve chemically treating the main body of a partially completed substrate in order to increase the flexibility of the region that will form the strain control region, or to increase the stiffness of the areas that will not form the strain control region. Processes such as implanting, annealing, and other types of chemical functionalization, as well as any combination of the techniques described herein, may also be employed.

Figure 13C:
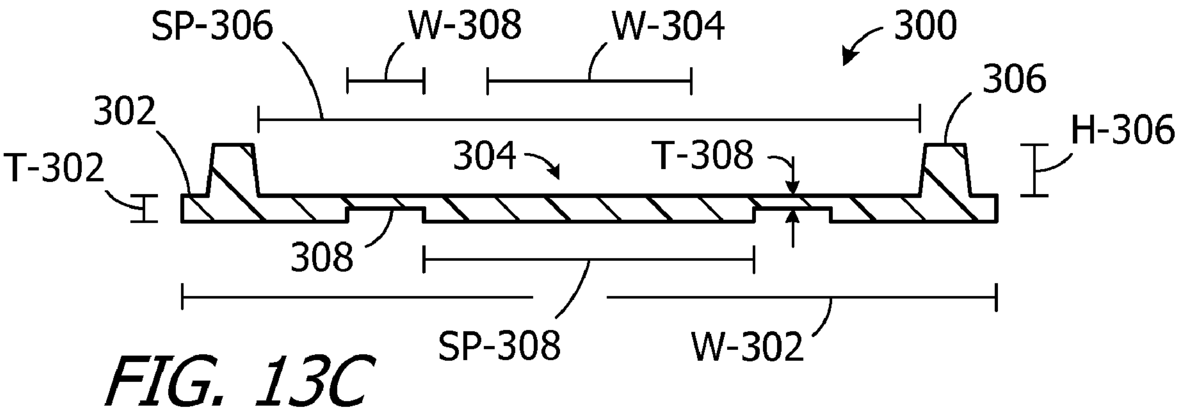
FIG. 13C is a section view of a substrate in accordance with one embodiment of a present invention.

Turning to FIG. 13C, and although the present substrates are not so limited, the dimensions of one exemplary implementation of a substrate 300 are as follows. The width W-302 and thickness T-302 of the substrate main body 302 are about 10-300 mm and about 0.1-5.0 mm, respectively. The height H-306 of the spacers 306 is about 0.1-10 μm. The target area width W-304 is about 1-100 mm. The strain control region thickness T-308 is about 0.01-0.50× (i.e. 0.01 to 0.50 times) the substrate main body thickness T-302, and the width W-308 is about 1-50× the strain control region thickness T-208. The spacing SP-308 between horizontally spaced portions of the strain control region 308 is about 1.1-3.0× the target area width W-304. The spacer spacing SP-306 is about 1.1-2.0× the spacing SP-308 between horizontally spaced portions of the strain control region 308.

Although the present inventions have been described in terms of the preferred embodiments above, numerous modifications and/or additions to the above-described preferred embodiments would be readily apparent to one skilled in the art. It is intended that the scope of the present inventions extend to all such modifications and/or additions.

Figure 15:
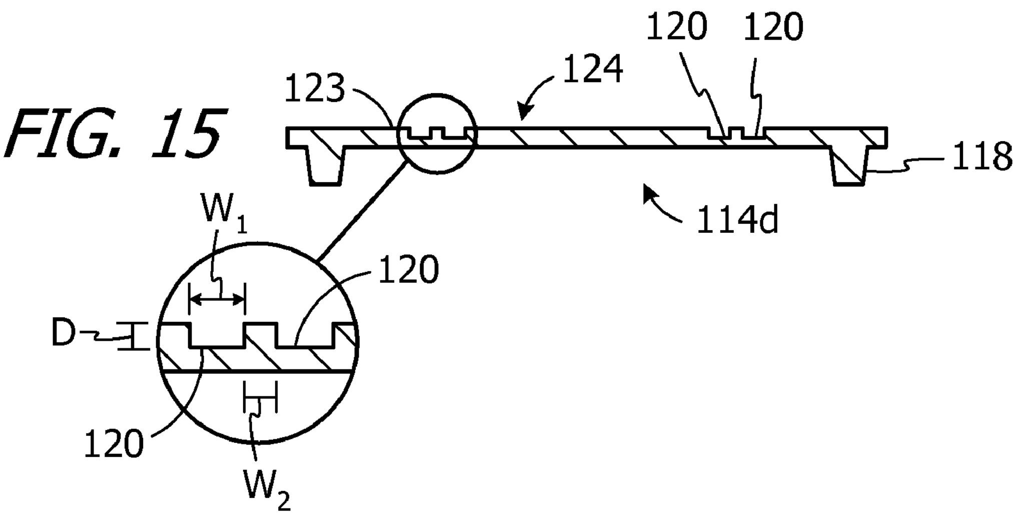
FIG. 15 is a section view of a pattern tool carrier in accordance with one embodiment of a present invention.
Figure 16:
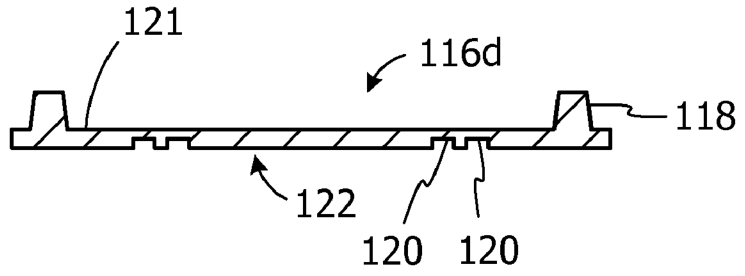
FIG. 16 is a section view of a substrate carrier in accordance with one embodiment of a present invention.
Figure 17:
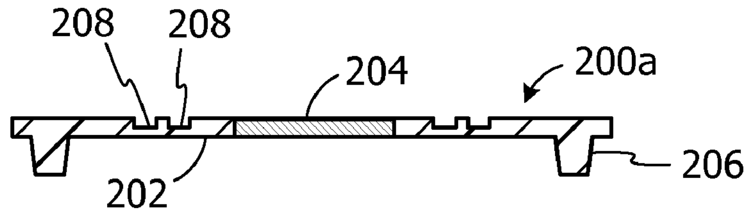
FIG. 17 is a section view of a pattern tool in accordance with one embodiment of a present invention.
Figure 18:
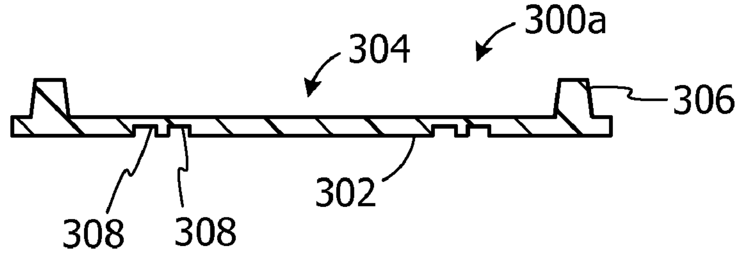
FIG. 18 is a section view of a substrate in accordance with one embodiment of a present invention.

For example, pattern tool carriers, substrate carriers, pattern tools and substrates in accordance with the present inventions may be provided with a plurality of strain control regions. The exemplary pattern tool carrier 114*d* illustrated in FIG. 15 is identical to the pattern tool carrier 114*a* illustrated in FIGS. 9A and 9B but for the fact that pattern tool carrier 114*d* includes two (as shown) or more strain control regions 120. The exemplary substrate carrier 116*d* illustrated in FIG. 16 is identical to the substrate carrier 116 illustrated in FIGS. 3A and 3B but for the fact that substrate carrier 116*d* includes two (as shown) or more strain control regions 120. The exemplary pattern tool 200*a* illustrated in FIG. 17 is identical to the pattern tool 200 illustrated in FIGS. 11A and 11B but for the fact that pattern tool 200*a* includes two (as shown) or more strain control regions 208. The exemplary substrate 300*a* illustrated in FIG. 18 is identical to the substrate 300 illustrated in FIGS. 13A and 13B but for the fact that substrate 300*a* includes two (as shown) or more strain control regions 308.

The strain control regions 120 in the exemplary pattern tool carrier 114*a* are identical to one another, the strain control regions 120 in the exemplary substrate carrier 116*a* are identical to one another, the strain control regions 208 in the exemplary pattern tool carrier 200*a* are identical to one another, and the strain control regions 308 in the exemplary substrate carrier 300*a* are identical to one another. However, the respective strain control regions in the devices illustrated in FIGS. 15-18 may also be different in one or more aspects. By way of example, but not limitation, such differences in the strain control regions of a particular device may include different sizes (e.g. different in width $W_1$ and/or depth D), different stiffnesses, different shapes in cross-section and/or in plan, location on different sides of the device, different continuities (e.g. one strain control region extends continuously and the other strain control region includes a plurality of spaced areas of increased flexibility), etc. Additionally, although the exemplary strain control regions are concentric in the embodiments illustrated in FIGS. 15-18, the strain control regions may also be non-concentric.

It should also be noted that, in the exemplary embodiments illustrated in FIGS. 15-18, the width $W_2$ of the respective regions of the pattern tool carrier, substrate carrier, pattern tool and substrate that are located between strain control regions are less than the width $W_1$ of the strain control regions. Nevertheless, the width $W_2$ of the respective regions of the pattern tool carrier, substrate carrier, pattern tool and substrate that are located between strain control regions may also be equal to, or greater than, the width $W_1$ of the strain control regions. Variations in the relative magnitude of the widths $W_1$ and $W_2$ may, for example, be used fine tune the amount of deformation that will be associated with a particular deformation force F (note FIGS. 4B, 10B, 12B and 14B). To that end, the "total strain control width" is equal to $2W_1+W_2$ and, for any given "total strain control width," deformation decreases as $W_2$ increases. This is also true in those instances where the widths $W_1$ of the strain control regions in a particular pattern tool carrier, substrate carrier, pattern tool or substrate are not the same size.

We claim:

1. A lithographic pattern tool, comprising:

a main body defining an outer perimeter;

a lithographic pattern region; and a strain control region located between the outer perimeter and the lithographic pattern region, wherein the strain control region is more flexible than the main body and comprises a region of reduced thickness in the main body.

2. A pattern tool as claimed in claim 1, further comprising:

at least one spacer associated with the main body and positioned such that the strain control region is located between the at least one spacer and the lithographic pattern region.

3. A pattern tool as claimed in claim 1, wherein the strain control region extends completely around the lithographic pattern region.

4. A pattern tool as claimed in claim 1, wherein the lithographic pattern region comprises a mask or a mold.

5. A pattern tool as claimed in claim 1, wherein the strain control region is configured such that the lithographic pattern region will experience approximately zero strain when the pattern tool is deformed through the application of force to the pattern tool.

6. A pattern tool as claimed in claim 5, further comprising:

a plurality of spacers associated with the main body and positioned such that the strain control region is located between the spacers and the lithographic pattern region.

7. A pattern tool as claimed in claim 1, wherein the strain control region defines a first strain control region, the pattern tool further comprising:

a second strain control region located between the outer perimeter and the first strain control region.

8. A pattern tool as claimed in claim 1, wherein the lithographic pattern region and the strain control region are integrally formed with the main body.

9. A substrate for use in deformation based lithography, comprising:

a main body defining an outer perimeter;

a target region; and a strain control region located between the outer perimeter and the target region, wherein the strain control region is more flexible than the main body and comprises a region of reduced thickness in the main body.

10. A substrate as claimed in claim 9, further comprising:

at least one spacer associated with the main body.

11. A substrate as claimed in claim 10, wherein the strain control region is located between the at least one spacer and the target region.

12. A substrate as claimed in claim 9, wherein the strain control region is configured such that the target region will experience approximately zero strain when the substrate is deformed through the application of force to the substrate.

13. A substrate as claimed in claim 12, further comprising:

a plurality of spacers associated with the main body and positioned such that the strain control region is located between the spacers and the target region.

14. A substrate as claimed in claim 9, wherein the strain control region extends completely around the target region.

15. A substrate as claimed in claim 9, wherein the strain control region defines a first strain control region, the substrate further comprising:

a second strain control region located between the outer perimeter and the first strain control region.

16. A substrate as claimed in claim 9, wherein the target region and the strain control region are integrally formed with the main body.

17. A contact lithography module, comprising:

a pattern tool carrier including a main body and a pattern tool mounting portion;

a substrate carrier including a main body and a substrate mounting portion; and at least one spacer located between the pattern tool carrier main body and the substrate carrier main body; and at least one of means for concentrating deformation-related strain in a portion of the main body in spaced relation to the pattern tool mounting portion and means for concentrating deformation-related strain in a portion of the main body in spaced relation to the substrate mounting portion.

18. A contact lithography module as claimed in claim 17, wherein the at least one spacer comprises a plurality of spacers.

19. A contact lithography module as claimed in claim 17, wherein the pattern tool carrier includes the means for concentrating deformation-related strain in a portion of the main body in spaced relation to the pattern tool mounting portion;

the at least one spacer comprises a plurality of spacers that are associated with the pattern tool carrier; and the means for concentrating deformation-related strain is located between the spacers and the pattern tool mounting portion.

20. A substrate as claimed in claim 19, wherein the means for concentrating deformation-related strain is integrally formed with the main body and the pattern tool mounting portion.

21. A contact lithography module as claimed in claim 17, wherein the substrate carrier includes the means for concentrating deformation-related strain in a portion of the main body in spaced relation to the substrate mounting portion;

the at least one spacer comprises a plurality of spacers that are associated with the substrate carrier; and the means for concentrating deformation-related strain is located between the spacers and the substrate mounting portion.

22. A substrate as claimed in claim 21, wherein the means for concentrating deformation-related strain is integrally formed with the main body and the substrate mounting portion.

* * * * *

UNITED STATES PATENT AND TRADEMARK OFFICE
CERTIFICATE OF CORRECTION

PATENT NO. : 7,618,752 B2
APPLICATION NO. : 11/548975
DATED : November 17, 2009
INVENTOR(S) : Duncan R. Stewart et al.

It is certified that error appears in the above-identified patent and that said Letters Patent is hereby corrected as shown below:

In column 15, line 10, in Claim 19, after "wherein" insert -- : --.

In column 16, line 6, in Claim 21, after "wherein" insert -- : --.

Signed and Sealed this

Eleventh Day of May, 2010

David J. Kappos

David J. Kappos
*Director of the United States Patent and Trademark Office*